United States Patent
Siemieniec et al.

(10) Patent No.: US 10,811,499 B2
(45) Date of Patent: Oct. 20, 2020

(54) WIDE BANDGAP SEMICONDUCTOR DEVICE INCLUDING TRANSISTOR CELLS AND COMPENSATION STRUCTURE

(71) Applicant: Infineon Technologies AG, Neubiberg (DE)

(72) Inventors: Ralf Siemieniec, Villach (AT); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/442,022

(22) Filed: Jun. 14, 2019

(65) Prior Publication Data
US 2020/0006495 A1    Jan. 2, 2020

Related U.S. Application Data

(63) Continuation of application No. 15/453,322, filed on Mar. 8, 2017, now abandoned.

(30) Foreign Application Priority Data

Mar. 9, 2016    (DE) .......................... 10 2016 104 256

(51) Int. Cl.
*H01L 29/78*    (2006.01)
*H01L 29/16*    (2006.01)
(Continued)

(52) U.S. Cl.
CPC .......... *H01L 29/1608* (2013.01); *H01L 23/34* (2013.01); *H01L 28/00* (2013.01);
(Continued)

(58) Field of Classification Search
CPC . H01L 29/93; H01L 27/0817; H01L 27/0921; H01L 27/1027; H01L 29/0626;
(Continued)

(56) References Cited

U.S. PATENT DOCUMENTS 3,757,245 A * 9/1973 Berger ................... H03B 5/364
                                                                  331/66
4,607,237 A    8/1986 Aota
(Continued)

FOREIGN PATENT DOCUMENTS

CN    105280636    1/2016
JP    H03-175814    7/1993
(Continued)

*Primary Examiner* — Bitew A Dinke
(74) *Attorney, Agent, or Firm* — Dicke, Billig & Czaja, PLLC

(57) ABSTRACT

A semiconductor device includes transistor cells in a semiconductor portion, wherein the transistor cells are electrically connected to a gate metallization, a source electrode and a drain electrode. In one example, the semiconductor device further includes a doped region in the semiconductor portion. The doped region is electrically connected to the source electrode. A resistance of the doped region has a negative temperature coefficient. An interlayer dielectric separates the gate metallization from the doped region. A drain structure in the semiconductor portion electrically connects the transistor cells with the drain electrode and forms a pn junction with the doped region.

22 Claims, 12 Drawing Sheets

(51) Int. Cl.
  *H03K 17/14* (2006.01)
  *H01L 49/02* (2006.01)
  *H01L 29/08* (2006.01)
  *H01L 23/34* (2006.01)
  *H01L 29/06* (2006.01)
  *H01L 29/10* (2006.01)
  *H01L 29/167* (2006.01)
  *H01L 29/417* (2006.01)
  *H01L 29/423* (2006.01)
  *H01L 27/06* (2006.01)
  *H01L 27/02* (2006.01)
  *H01L 21/82* (2006.01)
  *H01L 27/07* (2006.01)

(52) U.S. Cl.
  CPC ...... *H01L 29/0688* (2013.01); *H01L 29/0696* (2013.01); *H01L 29/0878* (2013.01); *H01L 29/0886* (2013.01); *H01L 29/1095* (2013.01); *H01L 29/167* (2013.01); *H01L 29/41741* (2013.01); *H01L 29/4236* (2013.01); *H01L 29/42364* (2013.01); *H01L 29/7802* (2013.01); *H01L 29/7803* (2013.01); *H01L 29/7805* (2013.01); *H01L 29/7813* (2013.01); *H01L 29/7827* (2013.01); *H03K 17/145* (2013.01); *H01L 21/8213* (2013.01); *H01L 27/0211* (2013.01); *H01L 27/0605* (2013.01); *H01L 27/0727* (2013.01); *H01L 29/4238* (2013.01); *H01L 29/42372* (2013.01)

(58) Field of Classification Search
  CPC ............... H01L 29/083; H01L 29/0834; H01L 29/0839; H01L 29/66356; H01L 29/66363; H01L 29/1608; H01L 28/00; H01L 29/7803; H01L 29/7813; H01L 29/0878; H01L 29/7805; H01L 23/34; H01L 29/0688; H01L 29/0696; H01L 29/0886; H01L 29/1095; H01L 29/167; H01L 29/41741; H01L 29/4236; H01L 29/42364; H01L 29/7802; H01L 29/7827; H01L 27/0605; H01L 27/0211; H01L 21/8213; H01L 29/42372; H01L 29/4238; H01L 29/78; H03H 7/251; H01H 2085/0483; H01H 27/0727; H02H 3/085; H03K 17/145

See application file for complete search history.

(56) References Cited

U.S. PATENT DOCUMENTS

| | | | | |
|---|---|---|---|---|
| 5,640,013 A * | 6/1997 | Ishikawa | ............... | H01L 27/146 250/332 |
| 5,726,481 A * | 3/1998 | Moody | ............... | H01L 27/0248 257/467 |
| 5,952,705 A * | 9/1999 | Michel | ............... | H01L 29/7813 257/551 |
| 8,946,850 B2 | 2/2015 | Schulze et al. | | |
| 9,515,145 B2 | 12/2016 | Furuhashi et al. | | |
| 9,576,944 B2 * | 2/2017 | Laven | ............... | H01L 27/0255 |
| 9,871,126 B2 | 1/2018 | Kiep et al. | | |
| 10,038,105 B2 * | 7/2018 | Basler | ............... | H01L 29/08 |
| 10,186,508 B2 * | 1/2019 | Ahlers | ............... | H01L 27/0288 |
| 2002/0105079 A1* | 8/2002 | Yamaguchi | ......... | H01L 23/4334 257/748 |
| 2004/0041201 A1 | 3/2004 | Sugiyama | | |
| 2005/0194635 A1* | 9/2005 | Pfirsch | ............... | H01L 29/7803 257/329 |
| 2007/0205464 A1* | 9/2007 | Sander | ............... | H01L 29/7803 257/350 |
| 2008/0164497 A1* | 7/2008 | von Borcke | ............ | H03K 17/14 257/252 |
| 2008/0265315 A1 | 10/2008 | Mauder | | |
| 2009/0315724 A1* | 12/2009 | Kim | ............... | G01K 3/005 340/584 |
| 2010/0090329 A1* | 4/2010 | Kwak | ............... | H01L 23/34 257/690 |
| 2010/0122976 A1* | 5/2010 | Kim | ............... | H01C 7/008 219/501 |
| 2010/0277847 A1* | 11/2010 | Li | ............... | H02H 3/087 361/111 |
| 2010/0301410 A1 | 12/2010 | Hirler | | |
| 2010/0309710 A1 | 12/2010 | Evans | | |
| 2011/0110068 A1* | 5/2011 | Hanaoka | ............ | H01L 29/7395 361/820 |
| 2011/0254613 A1* | 10/2011 | Kim | ............... | H01L 49/003 327/513 |
| 2013/0140616 A1* | 6/2013 | Schulze | ............... | H01L 27/0251 257/296 |
| 2014/0177304 A1* | 6/2014 | Sadwick | ............... | H02M 7/06 363/126 |
| 2014/0264343 A1* | 9/2014 | Harrington, III | ............ | H01L 29/66712 257/51 |
| 2015/0145437 A1 | 5/2015 | Limmer | | |
| 2015/0155355 A1 | 6/2015 | Losee et al. | | |
| 2015/0221756 A1 | 8/2015 | Vellei | | |
| 2015/0346245 A1 | 12/2015 | Kiep et al. | | |
| 2015/0364468 A1* | 12/2015 | Kiep | ............... | H01L 27/0629 257/139 |
| 2016/0262228 A1* | 9/2016 | Huang | ............... | H02M 5/25 |
| 2017/0373152 A1* | 12/2017 | Watanabe | ............ | H01L 29/0688 |

FOREIGN PATENT DOCUMENTS

| | | |
|---|---|---|
| JP | 2005-166930 | 6/2005 |
| JP | 2009-200103 | 9/2009 |
| JP | 2015-115452 | 6/2015 |
| WO | 2014/132582 | 9/2014 |

\* cited by examiner

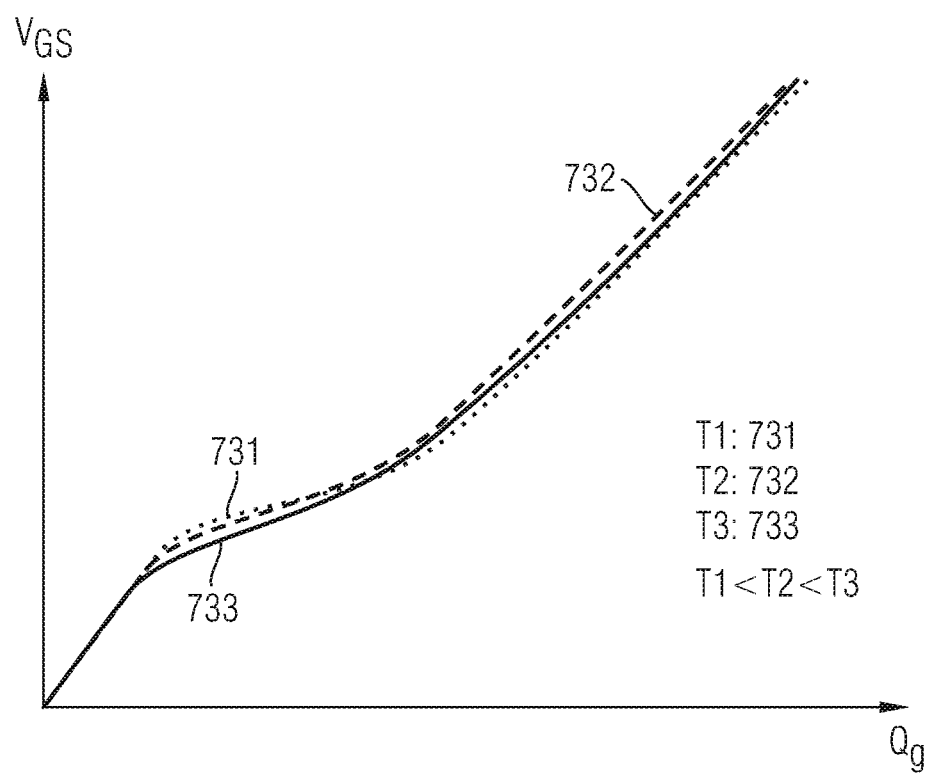

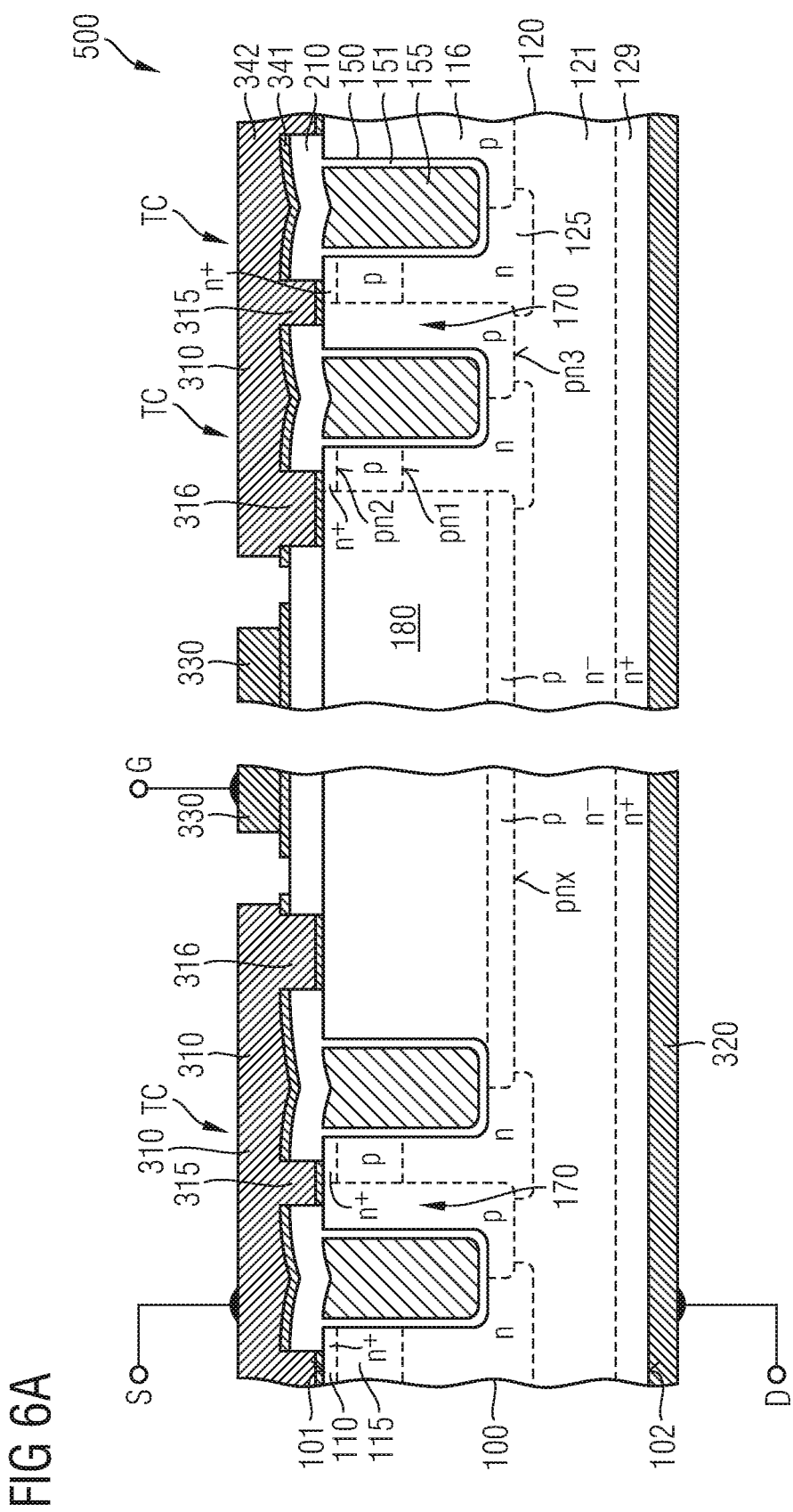

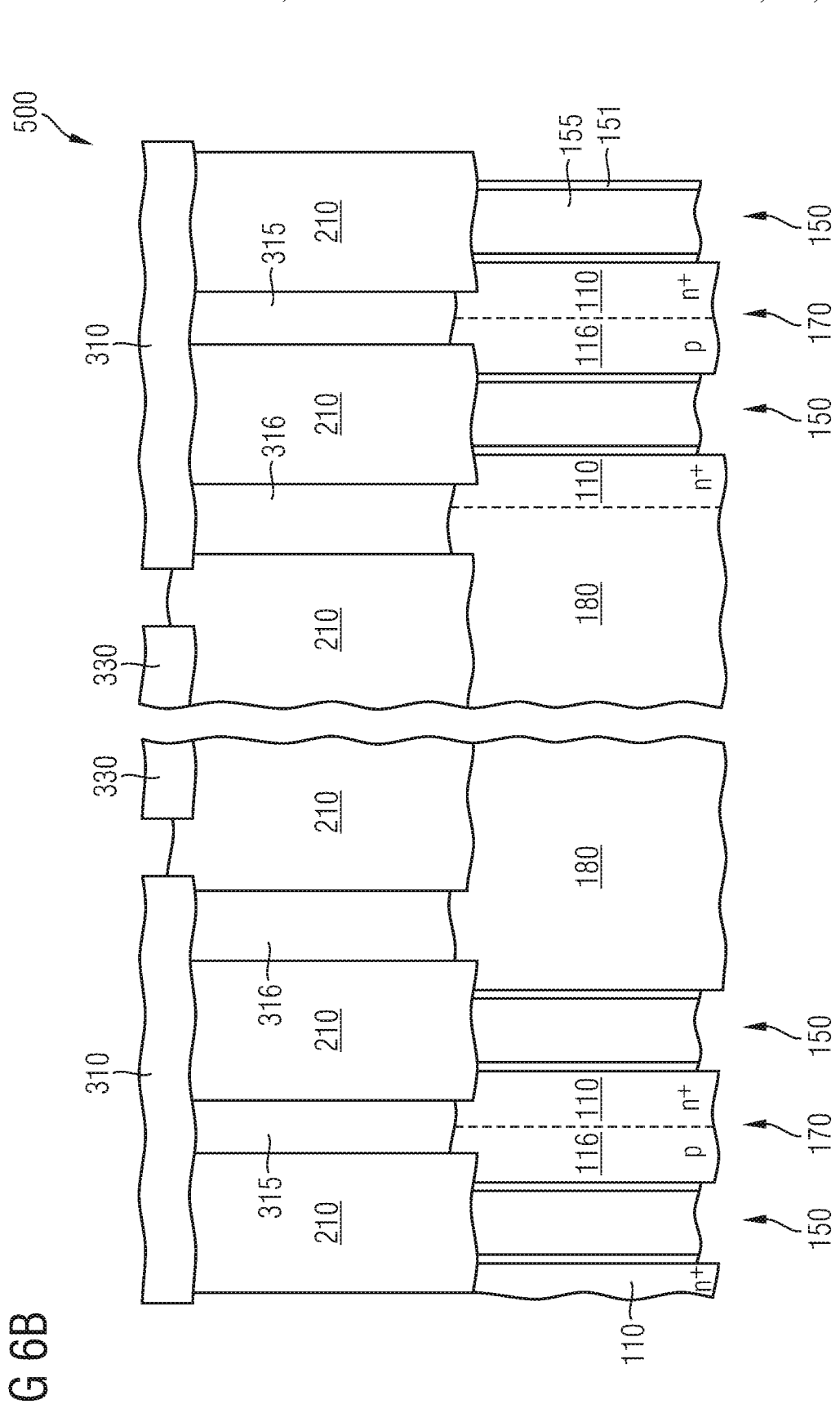

WIDE BANDGAP SEMICONDUCTOR DEVICE INCLUDING TRANSISTOR CELLS AND COMPENSATION STRUCTURE

CROSS-REFERENCE TO RELATED APPLICATION

This Utility Patent Applications is a continuation of U.S. patent application Ser. No. 15/453,322, filed Mar. 8, 2017, which claims priority to German Patent Application No. 10 2016 104 256.0, filed Mar. 9, 2016; both of which are incorporated herein by reference.

BACKGROUND

SiC MOSFETs (silicon carbide metal oxide semiconductor field effect transistors) exhibit lower on-state resistance at high temperatures, lower switching losses and lower leakage currents compared to conventional silicon MOSFETs. The gate dielectric of SiC MOSFETs may be economically formed by thermally oxidizing the SiC substrate to obtain a layer of silicon oxide Sift, wherein carbon residuals may result in that a density of interface states at the $SiO_2$/SiC interface is more than two orders of magnitude higher than at typical Si/$SiO_2$ interfaces. The interface states, which may also develop at interfaces between SiC and deposited silicon oxide, may adversely affect the performance of SiC-MOSFETs.

It is desirable to provide wide bandgap semiconductor devices with economically formed gate dielectrics and with stable and temperature-independent device parameters.

SUMMARY

According to an embodiment, a semiconductor device includes transistor cells formed in a semiconductor portion of a wide bandgap material. The transistor cells are electrically connected to a gate terminal, a source terminal, and a drain terminal. A compensation structure is electrically connected with the gate terminal and with at least one of the source terminal and the drain terminal. An effective capacitance of the compensation structure has a temperature coefficient at least partly compensating for a temperature coefficient of a ratio between a gate-to-drain capacitance and a gate-to-source capacitance of the transistor cells.

According to another embodiment, a semiconductor device includes transistor cells in a semiconductor portion of silicon carbide. The transistor cells are electrically connected to a gate metallization, a source electrode and a drain electrode. A doped region in the semiconductor region is electrically connected to the source electrode. A resistance of the doped region has a negative temperature coefficient. An interlayer dielectric separates the gate metallization from the doped region. A drain structure in the semiconductor portion electrically connects the transistor cells with the drain electrode and forms a pn junction with the doped region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5B is a schematic diagram illustrating a relationship between gate charge and gate-to-source voltage as a function of temperature for a semiconductor device according to the embodiments.

FIG. 6A is a schematic vertical cross-sectional view of a portion of a SiC MOSFET according to an embodiment concerning a layout with asymmetric transistor cells.

FIG. 6B is a schematic plan view of the semiconductor device portion of FIG. 6A.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection through a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
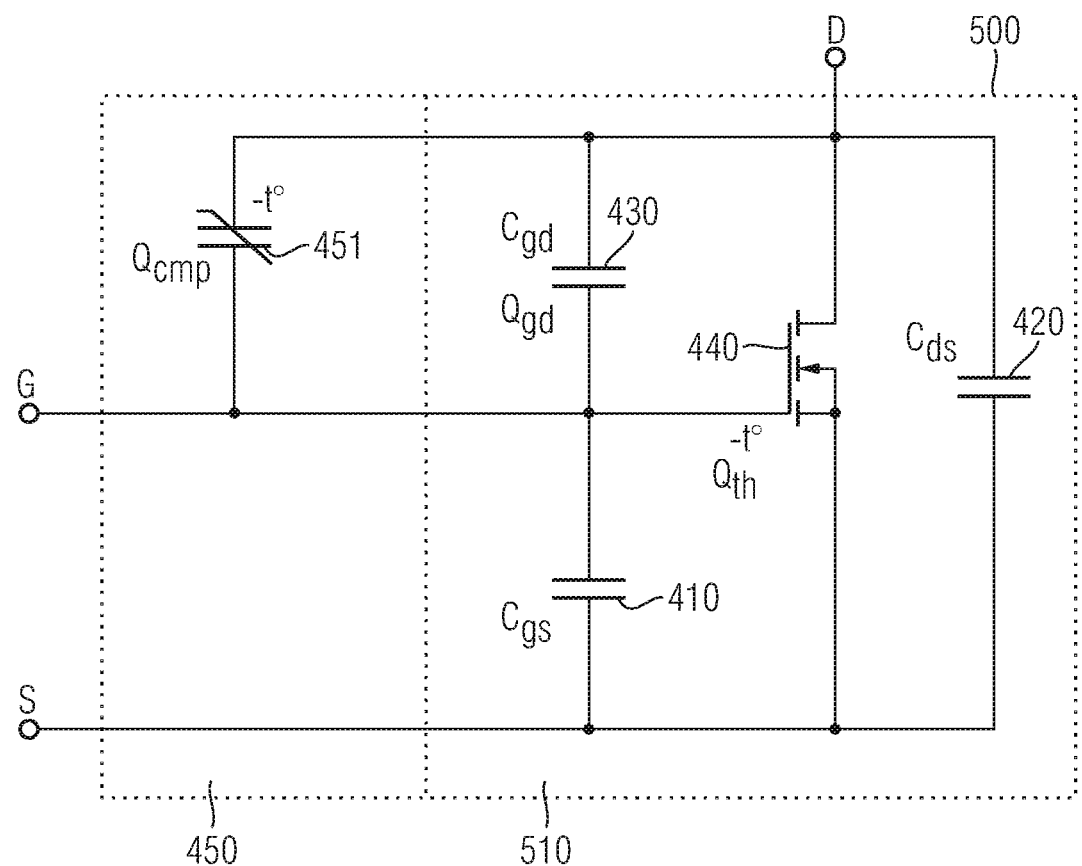
FIG. 1A is an equivalent circuit diagram of a semiconductor device with a compensation structure providing a capacitance with a temperature coefficient compensating a negative temperature coefficient of a gate-to-source capacitance of transistor cells according to an embodiment with the compensation structure connected between drain and gate terminal.

FIG. 1A refers to a semiconductor device 500 including a transistor cell arrangement 510 with a plurality of transistor cells electrically connected in parallel. The semiconductor device 500 may be or may include an IGFET (insulated gate field effect transistor), for example an MOSFET in the usual meaning including FETs with metal gates as well as FETs with semiconducting gates, e.g., from doped polycrystalline silicon or amorphous silicon, an IGBT (insulated gate bipolar transistor) or an MCD (MOS controlled diode), by way of example. The transistor cells TC may be field effect transistor cells, e.g., field effect transistor cells of the enhancement type.

The semiconductor device 500 is based on a semiconductor portion from a wide bandgap semiconductor with a bandgap of at least 2.0 eV at a temperature of 300 K. For example, the semiconductor material of the semiconductor portion is silicon carbide of the 4H polytype (4H-SiC) with a bandgap of 3.21 eV at 300 K.

The equivalent circuit diagram of the transistor cell arrangement 510 may include a capacitance-free transistor 440, which may be, for example, an IGFET of the enhancement type. A capacitance $C_{gd}$ (gate-to-drain capacitance) 430 is effective between a drain and a gate of the transistor cell arrangement 510. A capacitance $C_{gs}$ (gate-to-source capacitance) 410 is effective between the gate and the source. A $C_{ds}$ (drain-to-source capacitance) 420 is effective between the drain and the source.

The capacitance-free transistor 440 is characterized, inter alia, by a threshold voltage charge $Q_{th}$ defining the amount of charge necessary for lifting the potential at the gate of the capacitance-free transistor 440 to a threshold voltage at which a load current path between the drain and source of the capacitance-free transistor 440 becomes conductive. With increasing temperature less interface states along an interface between a gate dielectric of the transistor cells and the semiconductor portion remain electrically active such that the threshold voltage charge $Q_{th}$ decreases.

A Miller charge loading $C_{gd}$ 430 may remain unaffected or may also decrease to some degree. But the reduction of the threshold voltage charge $Q_{th}$ is significantly greater than any potential reduction of the Miller charge $Q_{gd}$ such that a ratio $Q_{gd}/Q_{th}$ has a positive temperature coefficient. Any change of a ratio between the Miller charge $Q_{gd}$ and the threshold voltage charge $Q_{th}$ significantly impacts device performance as regards unintentional turn-on and unintentional oscillations.

Typically, the ratio $Q_{gd}/Q_{th}$ affects the probability for that the SiC MOSFET unintentionally turns on when voltage peaks, which may be generated during turn-off of the SiC MOSFET, are coupled to the gate input through the Miller capacitance $C_{gd}$. The greater the Miller capacitance $C_{gd}$ is in relation to $C_{gs}$, the higher is the probability and the risk that the SiC MOSFET unintentional turns on. Unintentional turn-on decreases the efficiency of a switching circuit including the SiC MOSFET. Where the SiC MOSFET is a high-side switch or a low-side switch in a half-bridge circuit, a short-circuit condition with both switches turned on may occur. On the other hand, with decreasing ratio $Q_{gd}/Q_{th}$ the probability for triggering undesired oscillations in the application increases. It follows that SiC MOSFETs behave differently at different temperatures. Depending on the design of the SiC MOSFET either the risk for unintentional turn-on is high at an upper end of the nominal operational temperature range or the risk of unintentional oscillations is high at the lower end of the nominal operational temperature range.

A compensation structure 450 is electrically connected with the gate terminal G and at least one of the source terminal S and the drain terminal D of the semiconductor device 500. An effective capacitance of the compensation structure 450 is charged with a compensation charge $Q_{cmp}$. The effective capacitance of the compensation structure 450 is provided with a temperature coefficient at least partly compensating for the positive temperature coefficient of $Q_{gd}/Q_{th}$. In other words, the temperature coefficient of the effective capacitance of the compensation structure 450 compensates the temperature dependency of the ratio $C_{gd}/C_{gs}$ such that device parameters influenced by the ratio $C_{gd}/C_{gs}$ remain more stable across the total operational temperature range than without the compensation structure 450.

In FIG. 1A a first capacitive structure 451, which is electrically connected between the drain terminal D and the gate terminal G, represents the effective capacitance of the compensation structure 450. The effective capacitance of the compensation structure 450 is provided with a negative temperature coefficient. With increasing temperature less compensation charge $Q_{cmp}$ loads the effective capacitance of the compensation structure 450. The negative temperature coefficient of $Q_{cmp}$ is selected such that the ratio $(Q_{gd}+Q_{cmp})/Q_{th}$ between the sum of the Miller charge $Q_{gd}$ and the compensation charge $Q_{cmp}$ on the one hand and the threshold voltage charge $Q_{th}$ on the other hand is approximately constant within the operational temperature range the semiconductor device 500 is specified for. The negative temperature coefficient of the compensation structure 450 in the drain-to-gate-branch at least partially compensates the negative temperature coefficient of the threshold voltage charge $Q_{th}$ within the operational temperature range.

Figure 1B:
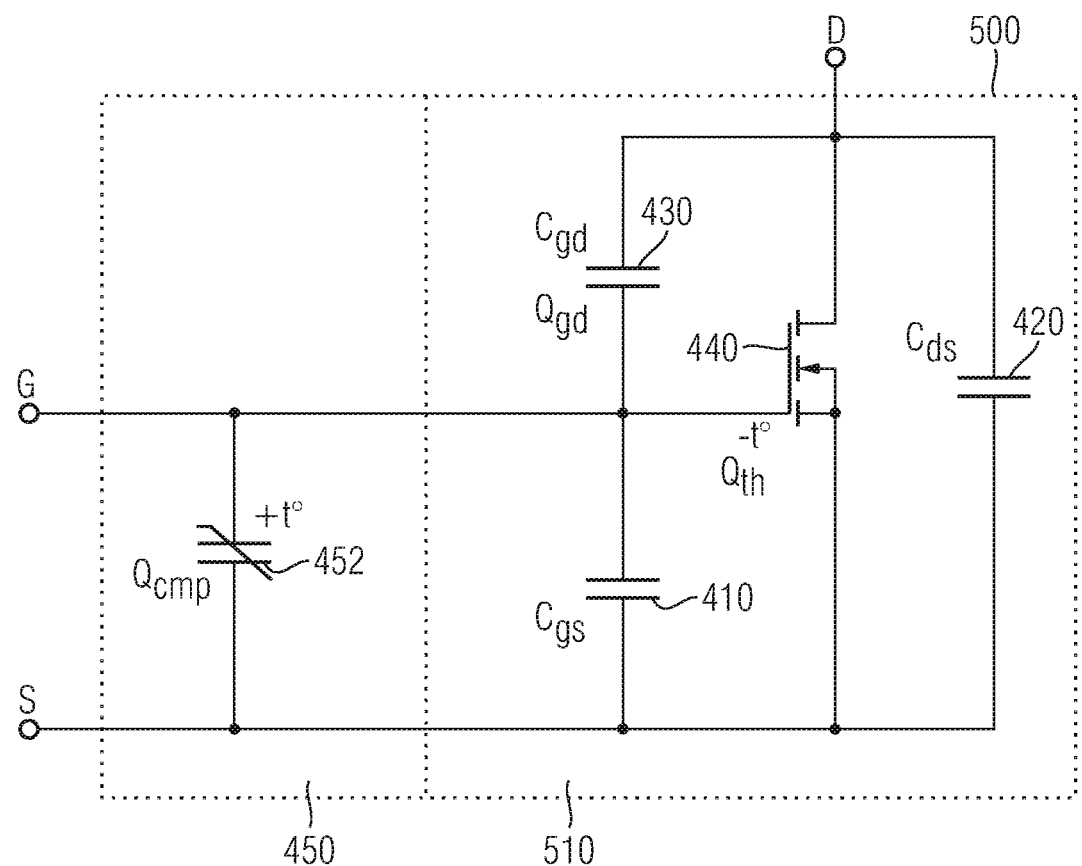
FIG. 1B is an equivalent circuit diagram of a semiconductor device with a compensation structure providing a capacitance with a temperature coefficient compensating a negative temperature coefficient of a gate-to-source capacitance of transistor cells according to an embodiment with the compensation structure connected between gate and source terminal.

In FIG. 1B a second capacitive structure 452, which is electrically connected between the gate terminal G and the source terminal S, represents the effective capacitance of the compensation structure 450. The effective capacitance of the compensation structure 450 is provided with a positive temperature coefficient. With increasing temperature more compensation charge $Q_{cmp}$ loads the effective capacitance of the compensation structure 450. The positive temperature coefficient of $Q_{cmp}$ is selected such that the ratio $Q_{gd}/(Q_{th}+Q_{cmp})$ between Miller charge $Q_{gd}$ and the sum of the threshold voltage charge $Q_{th}$ and the compensation charge $Q_{cmp}$ is approximately constant within the operational temperature range the semiconductor device 500 is specified for. The positive temperature coefficient of the compensation structure 450 in the gate-to-source-branch at least partially compensates the negative temperature coefficient of the threshold voltage charge $Q_{th}$ within the operational temperature range. The embodiments of FIGS. 1A and 1B may be combined with each other.

Figure 2:
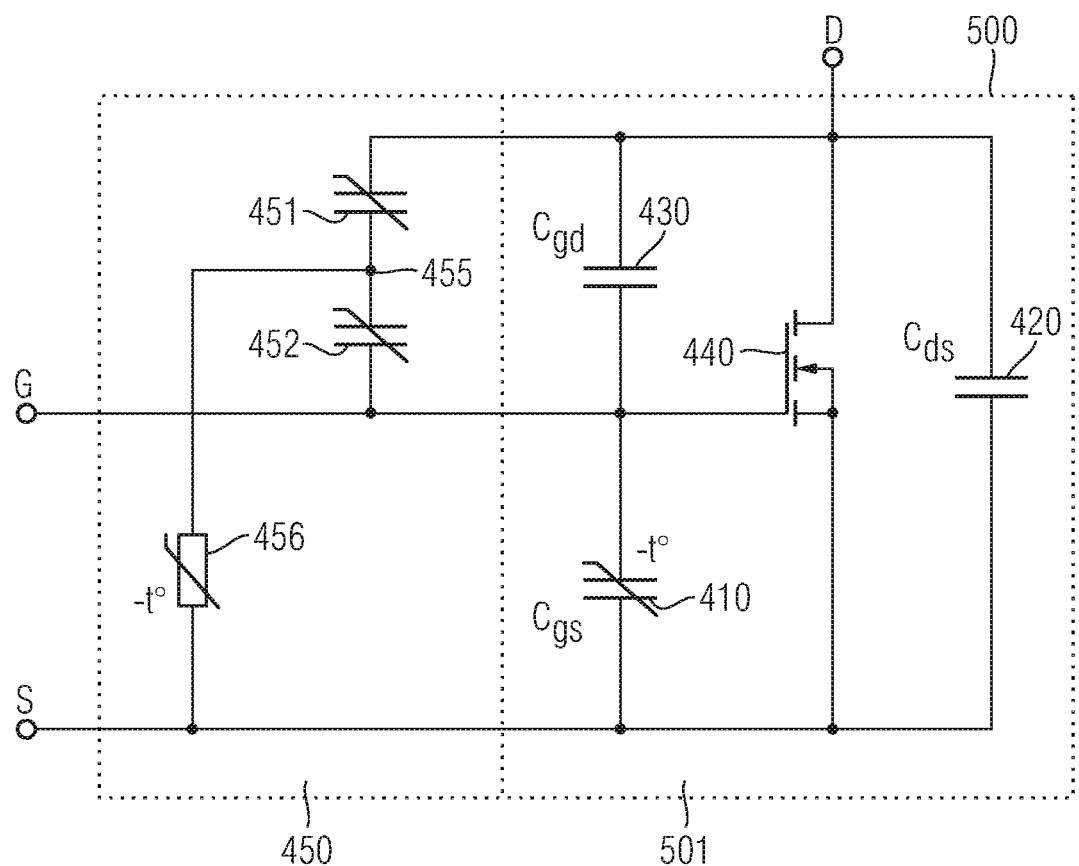
FIG. 2 is an equivalent circuit diagram of a semiconductor device including a compensation structure according to an embodiment with a thermistor structure with negative temperature coefficient.

In FIG. 2 the compensation structure 450 includes a first capacitive structure 451 and a second capacitive structure 452 electrically connected in series between the drain terminal D and the gate terminal G. A thermistor structure 456 with negative temperature coefficient is electrically connected between the source terminal S and a connection node 455 between the first and second capacitive structures 451, 452.

When the resistance of the thermistor structure 456 is high, a voltage drop across the thermistor structure 456 is comparatively high and the series connection of the first and second capacitive structures 451, 452 is electrically arranged mainly in parallel with $C_{gd}$ such that the total capacitance between drain and gate is high. In addition, the second capacitive structure 452 is highly decoupled from the source terminal S such that the second capacitive structure 452 contributes only to a low degree to a total capacitance between the gate terminal G and the source terminal S.

With increasing temperature the resistance of the thermistor structure 456 decreases and the voltage drop across the thermistor structure 456 gets smaller such that during switching operation an increasing portion of the load current loads the second capacitive structure 452 as a capacitance parallel to $C_{gs}$. With increasing temperature the second capacitive structure 452 increasingly contributes to the total capacity $C_{gs}$. In other words, the thermistor structure 456 and the second capacitive structure 452 form a compensation structure 450 with an effective capacitance between the gate terminal G and the source terminal S, wherein the effective capacitance has a positive temperature coefficient as discussed with reference to FIG. 1B.

In addition, with decreasing resistance of the thermistor structure 456 the first capacitive structure 451 gets better coupled to the source terminal S, whereas a degree of coupling with the gate terminal G decreases. The first capacitive structure 451 increasingly turns into a capacitance effective between the drain terminal D and the source terminal S and decreasingly contributes to the overall gate-to-drain capacitance $C_{gd}$. In other words, the first capacitive structure 451 and the thermistor structure 456 form a compensation structure 450 with an effective capacitance between the drain terminal D and the gate terminal G, wherein the effective capacitance has a negative temperature coefficient as discussed with reference to FIG. 1A. Device parameters related to the ratio $Q_{gd}/Q_{th}$ are more stable in a wider temperature range.

Figure 3A:
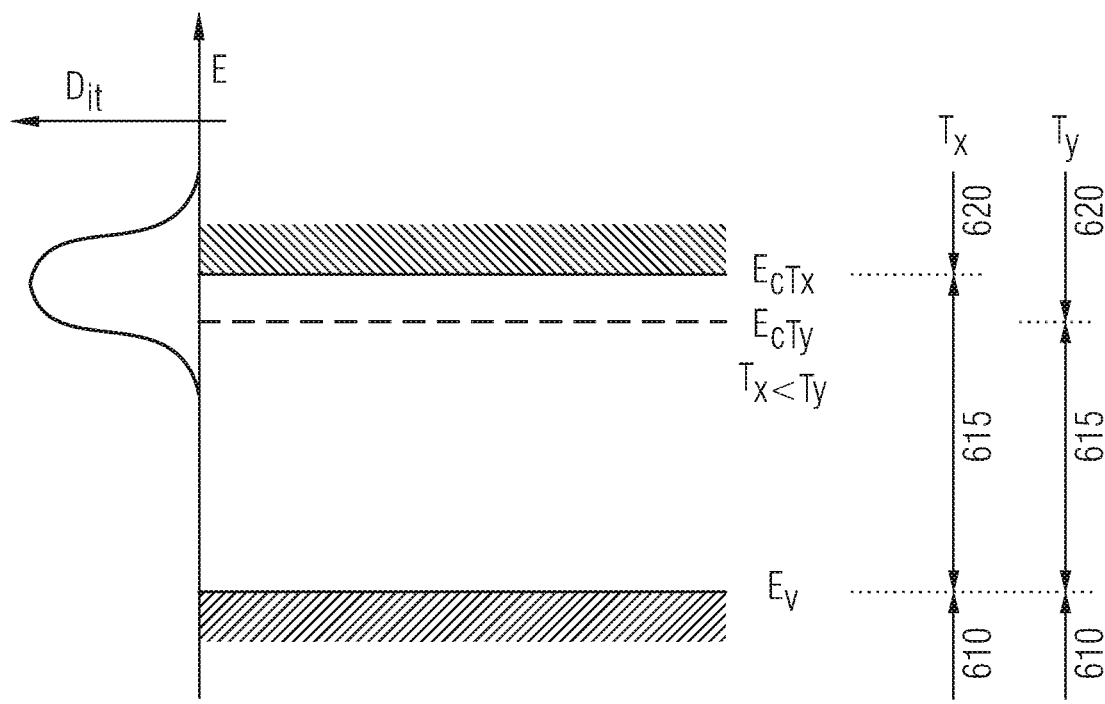
FIG. 3A is a schematic diagram illustrating interface state density along an SiC/$SiO_2$ interface for discussing background useful for understanding of the embodiments.

The right hand side of FIG. 3A shows an electronic band structure of a bandgap material. An upper edge $E_V$ of the valence band 610 represents the highest energy of electrons present in the bandgap material at absolute zero temperature. The lower edge $E_C$ of the conduction band 620 is the lowest energy level of vacant electronic states in the bandgap material. Within the bandgap 615 between $E_V$ and $E_C$ typically no vacant electron states exist.

The left hand side of FIG. 3A shows the density of interfaces states $D_{it}$ along an SiC/SiO$_2$ interface, wherein the interface states may mainly result from excess carbon atoms. The energy levels of the interface states are adjusted to the electronic band structure of the bandgap material. The interface states represent energy levels for electrons and are effective as acceptor states which are negatively charged if occupied with electrons.

In case an IGFET with a gate electrode, which controls an MOS channel in an SiC crystal, includes a gate dielectric with an SiC/SiO$_2$ interface, the number of such interface states affect the threshold voltage. Namely, the less interface states exist within the bandgap 615, the lower is a negative voltage bias induced by the electrons occupying the interface states at the gate dielectric, the lower is a threshold voltage $V_{th}$ that suffices for opening the MOS channel in the SiC crystal, and the lower is the threshold voltage charge $Q_{th}$.

At a temperature Tx=300 K a great portion of the interface state density $D_{it}$ distribution overlaps the bandgap 615. With increasing temperature the lower edge $E_C$ of the conduction band 620 drops and a smaller portion of the interface state density at distribution overlaps the bandgap 615 at a temperature Ty>Tx. Threshold voltage $V_{th}$ as well as threshold charge $Q_{th}$ drop accordingly.

Figure 3B:
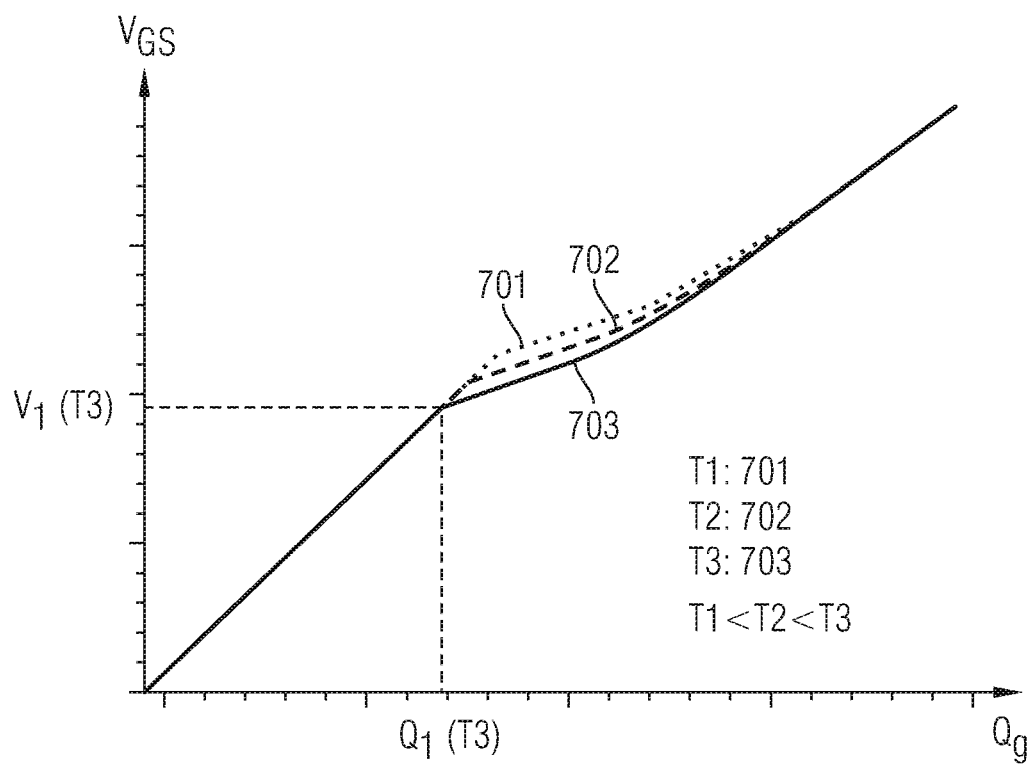
FIG. 3B is a schematic diagram illustrating a relationship between gate charge and gate-to-source voltage as a function of temperature in a SiC semiconductor device for discussing background useful for understanding of the embodiments.
Figure 3C:
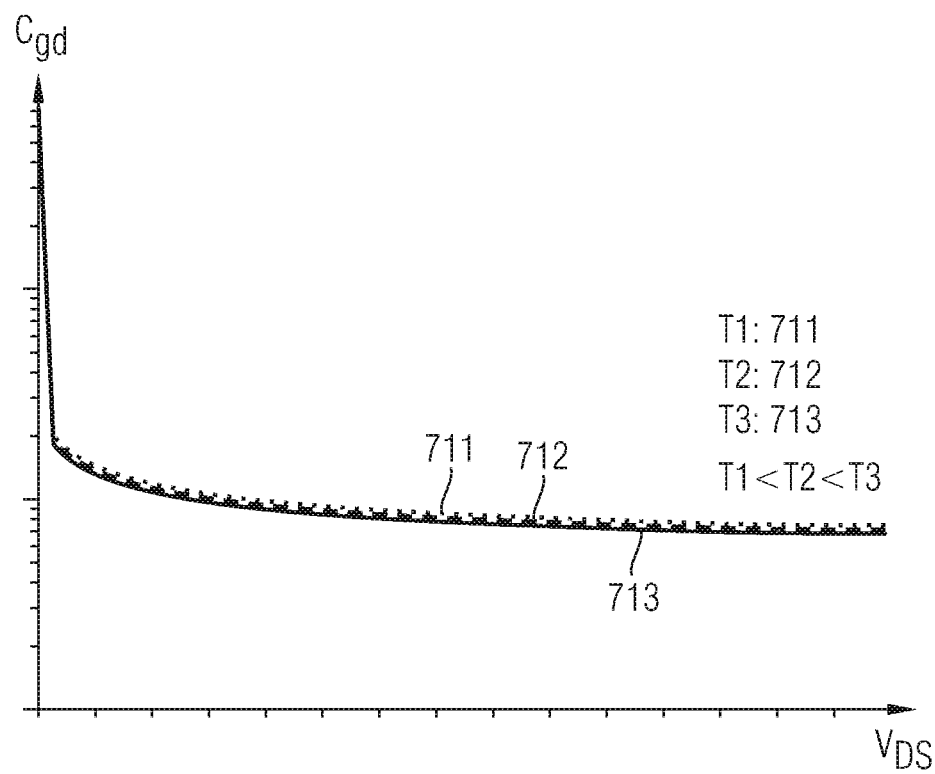
FIG. 3C is a schematic diagram illustrating a relationship between drain-to-source capacitance and drain-to-source voltage as a function of temperature for a SiC semiconductor device for discussing background useful for understanding of the embodiments.

The following FIGS. 3B and 3C refer to a simplified model of transistor cells and discount effects of other structures such as termination constructions and gate connections, e.g., gate pads.

In FIG. 3B line 701 plots $V_{GS}$ as a function of the gate charge $Q_g$ at a temperature T1=-40° C., line 702 at T2=25° C. and line 703 at T3=100° C. Bends between steeper portions of the lines 701, 702, 703 on the left hand side and less steep portions at the right hand side indicate a gate-to-source voltage $V_1$ and a gate charge $Q_1$ at which the opening MOS channel significantly affects the $V_{GS}/Q_g$ characteristic. A change of $V_1$ with temperature indicates an analogous change of the threshold voltage $V_{th}$ with temperature wherein the threshold voltage $V_{th}$ given in data sheets is typically defined for a state in which the MOS channel conducts a given drain current. Accordingly, the threshold charge $Q_{th}$ varies with $Q_1$. A decreasing $V_1$ results in a drop of the threshold charge $Q_{th}$ with increasing temperature indicating a decreasing presence of effective interface states in the bandgap.

The length of the Miller Plateaus represented by the projection of the less steep portions of lines 701, 702, 703 onto the abscissa and representing $Q_{gd}$ does not change or changes only to a very low degree, thereby indicating that $Q_{gd}$ is approximately stable over the pertinent temperature range.

In addition, in FIG. 3C line 711 plots $C_{gd}$ as a function of the drain-to-source voltage $V_{DS}$ at a temperature T1=-40° C., line 712 at T2=25° C. and line 713 at T3=100° C. For a given $V_{DS}$, also FIG. 3C shows that $C_{gd}$ and $Q_{gd}$ do not change significantly with temperature. As a consequence of $C_{gd}$ being more stable than $Q_{th}$, the ratios $Q_{gd}/Q_{th}$ and $C_{gd}/C_{gs}$ change with temperature.

As discussed above, conventional SiC MOSFETs with gate dielectrics formed by thermal oxidation or deposition of silicon oxide behave differently at different temperatures, wherein depending on the design of the SiC MOSFET either the risk for unintentional turn-on is high at an upper end of the nominal operational temperature range or the risk of unintentional oscillations is high at the lower end of the nominal operational temperature range.

By contrast, the compensation structures 450 as described, e.g., with reference to FIGS. 1A, 1B and 2 compensate for effects resulting from a drop of the threshold charge $Q_{th}$ with increasing temperature such that the SiC MOSFET has both a low risk of unintentional turn-on and a low occurrence of oscillations across the whole operational temperature range.

The compensation structure 450 of FIGS. 1A, 1B and 2 may be realized outside a housing of the semiconductor device 500 or may be integrated in and/or on the same semiconductor portion in which the transistor functionality is realized. The compensation structure 450 may include dedicated structures serving only for compensating the temperature drift of the ratio $Q_{gd}/Q_{th}$. According to another embodiment, the compensation structure 450 may include elements serving also other purposes.

Figure 4A:
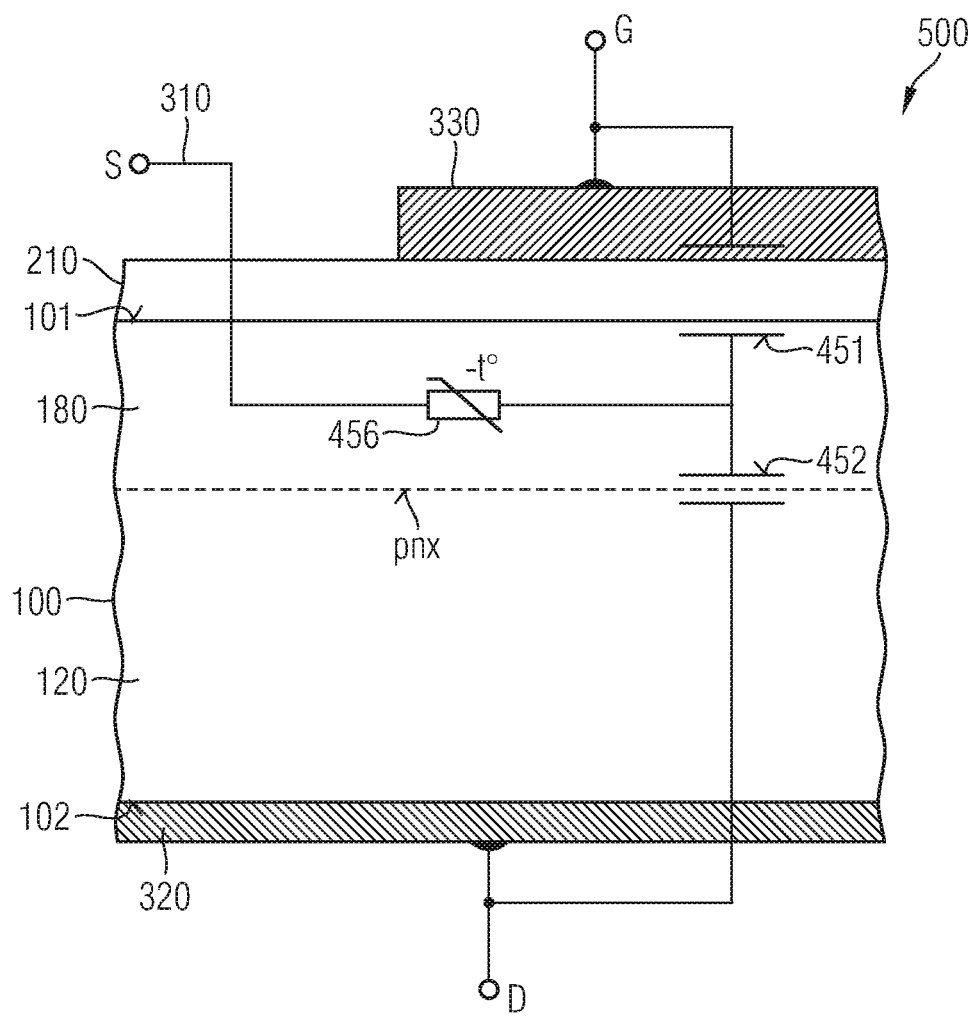
FIG. 4A is a schematic vertical cross-sectional view of a portion of a semiconductor device according to an embodiment including a compensation structure based on a doped region with a resistivity with negative temperature coefficient.

The semiconductor device 500 of FIG. 4A uses a portion of a gate metallization 330, which may be a gate pad or a gate connection line, e.g., a gate runner, a gate finger or a gate ring as a first electrode of the first capacitive structure 451 of FIG. 2.

The semiconductor device 500 includes transistor cells formed in a semiconductor portion 100 and may be or may include an IGFET, for example an MOSFET, an IGBT or an MCD. The semiconductor portion 100 is from crystalline wide bandgap semiconductor material such as SiC, for example 4H-SiC.

At a front side the semiconductor portion 100 has a first surface 101 which may include coplanar surface sections. The first surface 101 may coincide with a main crystal plane or may be tilted to a main crystal plane by an off-axis angle, which absolute value may be at least 2° and at most 12°, e.g., about 4°. According to an embodiment, the first surface 101 may be serrated and includes parallel first surface sections shifted to each other and tilted to a horizontal plane as well as second surface sections tilted to the first surface sections and connecting the first surface sections such that cross-sectional line of the serrated first surface 101 approximates a saw-tooth line.

On the back of the semiconductor portion 100 an opposite second surface 102 may extend parallel to the first surface 101. A distance between the first surface 101 at the front and a second surface 102 on the back is related to a nominal blocking capability of the semiconductor device 500. A total thickness of the semiconductor portion 100 between the first and second surfaces 101, 102 may be in the range of several hundred nm to several hundred μm. The normal to the first surface 101 defines a vertical direction and directions parallel to the first surface 101 are horizontal directions.

The semiconductor portion 100 includes a doped region 180 which is electrically connected to a source electrode 310, wherein the doped region 180 may be connected to the source electrode 310 on one side of the gate metallization 330 or on opposite sides of the gate metallization 330. The doped region 180 may directly adjoin to the first surface 101 or may be spaced from the first surface 101, wherein one or more unipolar homojunctions or pn junctions may be formed between the first surface 101 and the doped region 180. A resistivity of at least a portion the doped region 180 has a negative temperature coefficient. According to an embodiment, the whole doped region 180 or a portion of the doped region 180 contains aluminum (Al) atoms at a density in a range from at least $5E17$ cm$^{-3}$ up to $1E19$ cm$^{-3}$, by way of example. In addition to aluminum, the doped region 180 may include further dopants, for example boron (B) atoms. The doped region 180 forms a thermistor structure 456 as described with reference to FIG. 2.

A drain structure 120 forms a pn junction pnx with the doped region 180 and may separate the doped region 180 from a drain electrode 320 at the back. The drain structure 120 may include at least a heavily doped contact layer forming an ohmic contact with a drain electrode 320 directly adjoining to the second surface 102 and a lightly doped drift zone between the heavily doped contact layer and the pn junction pnx.

A portion of an interlayer dielectric 210 separates the gate metallization 330 from the semiconductor portion 100. The interlayer dielectric 210 may include one or more dielectric layers from silicon oxide, silicon nitride, silicon oxynitride, doped or undoped silicate glass, for example BSG (boron silicate glass), PSG (phosphorus silicate glass), BPSG (boron phosphorus silicate glass), FSG (fluorosilicate glass) or a spin-on glass, by way of example. At least a portion of the gate metallization 330 is in a vertical projection of at least a portion of the doped region 180 containing Al. The gate metallization 330 and the doped region 180 form the electrodes of a first capacitive structure 451 as described in FIG. 2.

The doped region 180 and the drain structure 120 form electrodes of the second capacitive structure 452 of FIG. 2, wherein the capacitance of the second capacitive structure 452 is given by the junction capacitance of the pn junction pnx between the doped region 180 and the drain structure 120.

The resistivity of the doped region 180 has a negative temperature coefficient. At low operation temperatures, the resistance of the doped region 180 is high and the resulting lateral voltage drop across the doped region 180 in direction of the center axis of the gate metallization 330 is comparatively high such that capacitive coupling between the gate metallization 330 and the drain electrode 320 is high. With increasing temperature an increasing portion of a current that charges the junction capacitance of the pn junction pnx flows to the source electrode 310 such that the doped region 180 increasingly shields the gate metallization 330 against the drain electrode 320. The effective capacitance between gate metallization 330 and drain electrode 320 drops with increasing temperature.

In SiC semiconductor devices the chip area is significantly smaller than in silicon devices such that the contribution of the gate metallization 330 to the total $C_{gd}$ is comparatively high and a comparatively small change of the contribution of the gate metallization 330 to the total $C_{gd}$ suffices to compensate for the change of the threshold potential charge $Q_{th}$.

Figure 4B:
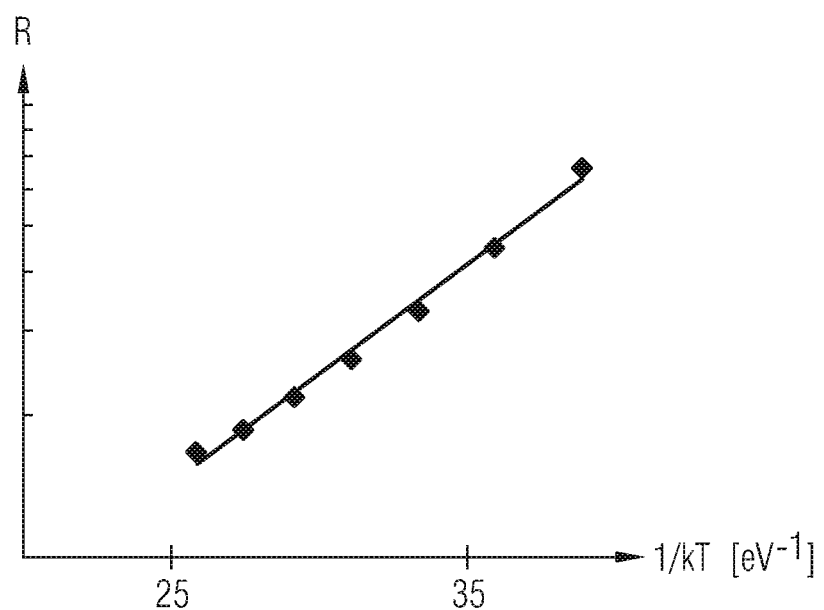
FIG. 4B is a schematic diagram showing the resistivity of a doped region containing aluminum as a function of reciprocal temperature.

FIG. 4B schematically shows the temperature dependency of the resistance of an SiC crystal containing aluminum atoms, wherein the density of aluminum atoms is in a range from at least $5E17$ cm$^{-3}$ up to $1E19$ cm$^{-3}$, by way of example and wherein the scale of the resistance is a logarithmic one. As a consequence of the deep acceptor energy level of aluminum of about 200 meV, aluminum atoms not completely ionize at the lower end of the operational temperature range. With increasing temperature the hole concentration increases to a degree that the conductivity in the doped SiC crystal increases despite decreasing mobility of holes with increasing temperature.

Figure 5A:
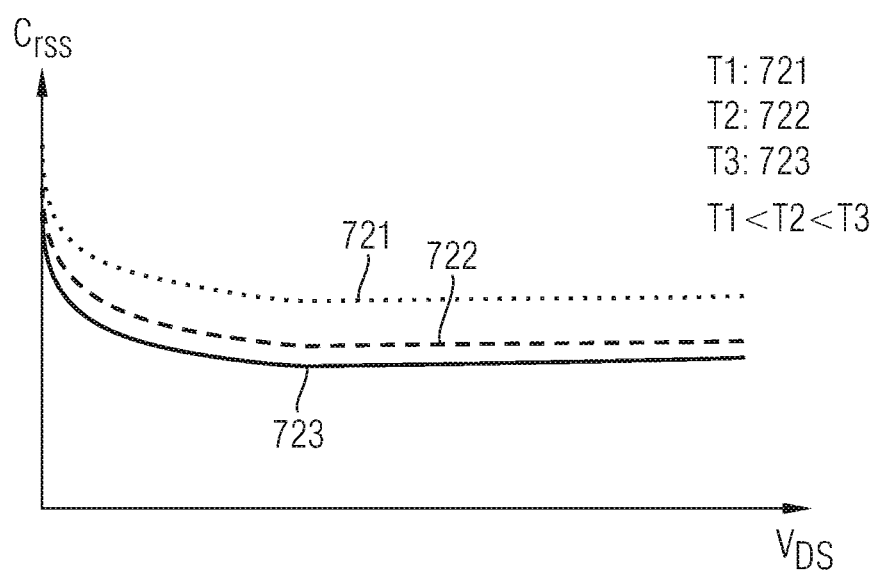
FIG. 5A is a schematic diagram for illustrating a relationship between drain-to-gate capacitance and drain-to-source voltage as a function of temperature for a semiconductor device according to the embodiments.

FIGS. 5A to 5B illustrate the effect of the compensation structure 450 of FIG. 4A for a functional semiconductor device with a blocking capability of 650 V and a total chip area of 4 mm$^2$ and take into account effects of both the transistor cells and other structures such as termination constructions and gate connections. A center-to-center distance between neighboring transistor cells is in a range from, e.g., 2.5 µm to 6.5 µm.

In FIG. 5A line 721 shows, at logarithmic scale, the total $C_{gd}$ as a function of $V_{DS}$ at a temperature T1=−40° C., line 722 at a temperature T2=25° C. and line 723 at a temperature T3=100° C. At a blocking voltage of 300 V, $C_{gd}$ at −40° C. is about 2.5 times the $C_{gd}$ at 100° C. Since the contribution of the transistor cells to $C_{gd}$ does not change with the temperature as shown in FIG. 3C, the temperature dependency exclusively results from the compensation structure 450.

In FIG. 5B line 731 plots $V_{GS}$ as a function of $Q_G$ for a temperature T1=−40° C., line 732 for a temperature T2=25° C., and line 733 for a temperature T3=100° C. The relative change of $V_{th}$ and, as a consequence, of $Q_{th}$ is significantly smaller than in FIG. 3A.

FIGS. 6A and 6B refer to an embodiment of a semiconductor device 500 in which the compensation structure 450 includes portions of a gate metallization 330, which may be a gate pad or gate runner. The semiconductor device 500 may be or may include an IGFET, for example an MOSFET, an IGBT or an MCD and includes a semiconductor portion 100 with a doped region 180 forming a thermistor structure, a gate metallization 330, and an interlayer dielectric 210 separating the gate metallization 330 from the semiconductor portion 100 as described in detail with reference to FIG. 4A.

The semiconductor device 500 further includes transistor cells TC formed in the semiconductor portion 100 along trench gate structures 150 which extend from the first surface 101 into the semiconductor portion 100, wherein mesa sections 170 of the semiconductor portion 100 separate neighboring trench gate structures 150.

A longitudinal extension of the trench gate structures 150 along a first horizontal direction may be greater than a transverse extension along a second horizontal direction orthogonal to the first horizontal direction. The trench gate structures 150 may be long stripes extending from one side of a transistor cell region to an opposite side, wherein the length of the trench gate structures 150 may be up to several millimeters. According to other embodiments a plurality of separated trench gate structures 150 may be arranged along a line extending from one side of the transistor cell region to the opposite side, or the trench gate structures 150 may form a grid with the mesa sections 170 formed in the meshes of the grid.

The trench gate structures 150 may be equally spaced, may have equal width, and may form a regular pattern, wherein a pitch (center-to-center distance) of the trench gate structures 150 may be in a range from 1 µm to 10 µm, e.g., from 2 µm to 5 µm. A vertical extension of the trench gate structures 150 may be in a range from 0.3 µm to 5 µm, e.g., in a range from 0.5 µm to 2 µm.

The trench gate structures 150 include a conductive gate electrode 155 which may include or consist of a heavily doped polycrystalline silicon layer and/or a metal-containing layer. The trench gate structures 150 further include a gate dielectric 151 separating the gate electrode 155 from the semiconductor portion 100 along at least one side of the trench gate structure 150. The gate dielectric 151 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 151 may be formed for a threshold voltage of the transistor cells TC in a range from 1.5 V to 6 V.

The trench gate structures 150 may exclusively include the gate electrode 155 and the gate dielectric 151 or may include further conductive and/or dielectric structures in addition to the gate electrode 155 and the gate dielectric 151, e.g., compensation structures.

The trench gate structures 150 may be vertical to the first surface 101 or may taper with increasing distance to the first surface 101. For example, a taper angle of the trench gate structures 150 with respect to the vertical direction may be equal to the off-axis angle or may deviate from the off-axis angle by not more than ±1 degree such that at least one of two opposite mesa sidewalls is formed by a crystal plane providing high charge carrier mobility.

The mesa sections 170 include source zones 110 that are oriented to the front side and that directly adjoin to at least one of the sidewalls of the respective mesa section 170. In the mesa section 170, the source zones 110 may directly adjoin to the first surface 101, may directly adjoin to the opposite mesa sidewall or may be spaced from the opposite mesa sidewall.

The mesa sections 170 further include body zones 115 that separate the source zones 110 from a drain structure 120, wherein the body zones 115 form first pn junctions pn1 with the drain structure 120 and second pn junctions pn2 with the source zones 110. The body zones 115 directly adjoin to one mesa sidewall or may directly adjoin to both mesa sidewalls. The gate dielectric 151 capacitively couples portions of the body zones 115 with the gate electrode 155. Both the source zones 110 and the body zones 115 are electrically connected to a source electrode 310 at the front side. A vertical extension of the body zones 115 corresponds to a channel length of the transistor cells TC and may be in a range from 0.2 µm to 1.5 µm.

The semiconductor portion 100 may further include diode regions 116 forming third pn junctions pn3 with the drain structure 120. The diode regions 116 are electrically connected or coupled to the source electrode 310 and may vertically overlap with the trench gate structures 150 such that portions of the diode regions 116 are formed in the vertical projection of the trench gate structures 150 and shield active portions of the gate dielectric 151 against the high potential of the drain electrode 320 in a blocking state of the semiconductor device 500. The diode regions 116 form third pn junctions pn3 with the drain structure 120 and provide a fly back diode functionality integrated in the semiconductor device 500. A distance between opposing edges of neighboring diode regions 116 may be in a range from 2 µm to 3 µm, by way of example.

The drain structure 120 is oriented to the back, may directly adjoin to the second surface 102 and is electrically connected or coupled to a drain electrode 320 through an ohmic contact. The drain structure 120 may include a lightly doped drift zone 121 that may form the first and third pn junctions pn1, pn3 as well as the pn junction pnx with the doped region 180 and may further include a heavily doped contact layer 129 between the drift zone 121 and the second surface 102.

The net dopant concentration in the drift zone 121 may be in a range from $1E14$ $cm^{-3}$ to $3E16$ $cm^{-3}$ in case the semiconductor portion 100 is formed from silicon carbide. A mean dopant concentration in the contact layer 129 is sufficiently high to ensure an ohmic contact with the drain electrode 320 that directly adjoins to the second surface 102. In case the semiconductor device 500 is an MCD or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

The drain structure 120 may also include current spread zones 125 which may directly adjoin to the body zones 115. The current spread zones 125 may extend between neighboring diode regions 116, wherein unipolar homojunctions between the current spread zones 125 and the drift zone 121 may have a greater distance to the first surface 101 than the third pn junctions pn3 formed between the diode regions 116 and the drift zone 121. Portions of the current spread zones 125 may overlap with the vertical projection of the diode regions 116 and may extend between neighboring diode regions 116.

A mean net dopant concentration in the current spread zones 125 is at least ten times as high as a mean net dopant concentration in the drift zone 121. The reduced horizontal resistance of the current spread zones 122 laterally spreads an on-state current of the transistor cells TC such that a current distribution in the drift zone 121 is more uniform.

Each of the source electrode 310, the gate metallization 330 and the drain electrode 320 may consist of or contain, as main constituent(s), aluminum (Al), copper (Cu), or alloys of aluminum or copper such as AlSi, AlCu or AlSiCu. According to other embodiments, at least one of the source and drain electrodes 310, 320 may contain, as main constituent(s), nickel (Ni), titanium (Ti), tungsten (W), tantalum (Ta), vanadium (V), silver (Ag), gold (Au), tin (Sn), platinum (Pt), and/or palladium (Pd). One of the source and drain electrodes 310, 320 or both may include two or more sub-layers, wherein each sub-layer contains one or more of Ni, Ti, V, Ag, Au, W, Sn, Pt, and Pd as main constituent(s), e.g., a silicide, a nitride and/or an alloy.

For example, the source electrode 310 and the gate metallization 330 may include a thin metal-containing interface layer 341 of titanium and a main layer 342 of, e.g., aluminum, copper, nickel or a combination or compound thereof.

The source electrode 310 may form or may be electrically connected or coupled to a source terminal S. The drain electrode 320 may form or may be electrically connected to a drain terminal D and the gate metallization 330 may form or may be electrically coupled or connected to a gate terminal G.

According to an embodiment, the transistor cells TC are n-channel FET cells of the enhancement type with p-doped body zones 115 and n-doped source zones 110, wherein the diode regions 116 are p-doped and the drift zone 121 is n-doped. According to another embodiment, the transistor cells TC are p-channel FET cells of the enhancement type with n-doped body zones 115 and p-doped source zones 110, wherein the diode regions 116 are n-doped and the drift zone 121 is p-doped.

When a potential at the gate electrode 155 exceeds or falls below a threshold voltage of the semiconductor device 500, minority charge carriers in the body zones 115 form inversion channels connecting the source zones 110 with the drain structure 120, thereby turning on the semiconductor device 500. In the on-state, the load current flows through the semiconductor portion 100 approximately along the vertical direction between the source and drain electrodes 310, 320.

First contact structures 315 extend from the source electrode 310 through openings in the interlayer dielectric 210 to the semiconductor portion 100 and directly adjoin to the source zones 110 and the diode regions 116. According to the illustrated embodiment the first contact structures 315 end on the first surface 101. According to other embodiments, the first contact structures 315 may extend into the semiconductor portion 100. Second contact structures 316 extend through the interlayer dielectric 210 and electrically connect the source electrode 310 with the doped region 180.

According to other embodiments, the layout of the transistor cell field may include symmetric transistor cells with the source and body zones formed symmetric to a longitudinal center axis of the trench gate structures. According to other embodiments, the diode regions are formed separated from the first surface and contacts splitting the trench gate structures in half trench structures electrically connect the diode regions with the source electrode. Alternatively or in addition, transistor cells may alternate with other structures, e.g., diode regions along two orthogonal horizontal directions. The gate structures 150 may be planar gates formed outside of the semiconductor portion 100, wherein the gate dielectric 151 may be formed directly adjoining to or at least parallel to the first surface 101.

Figure 7:
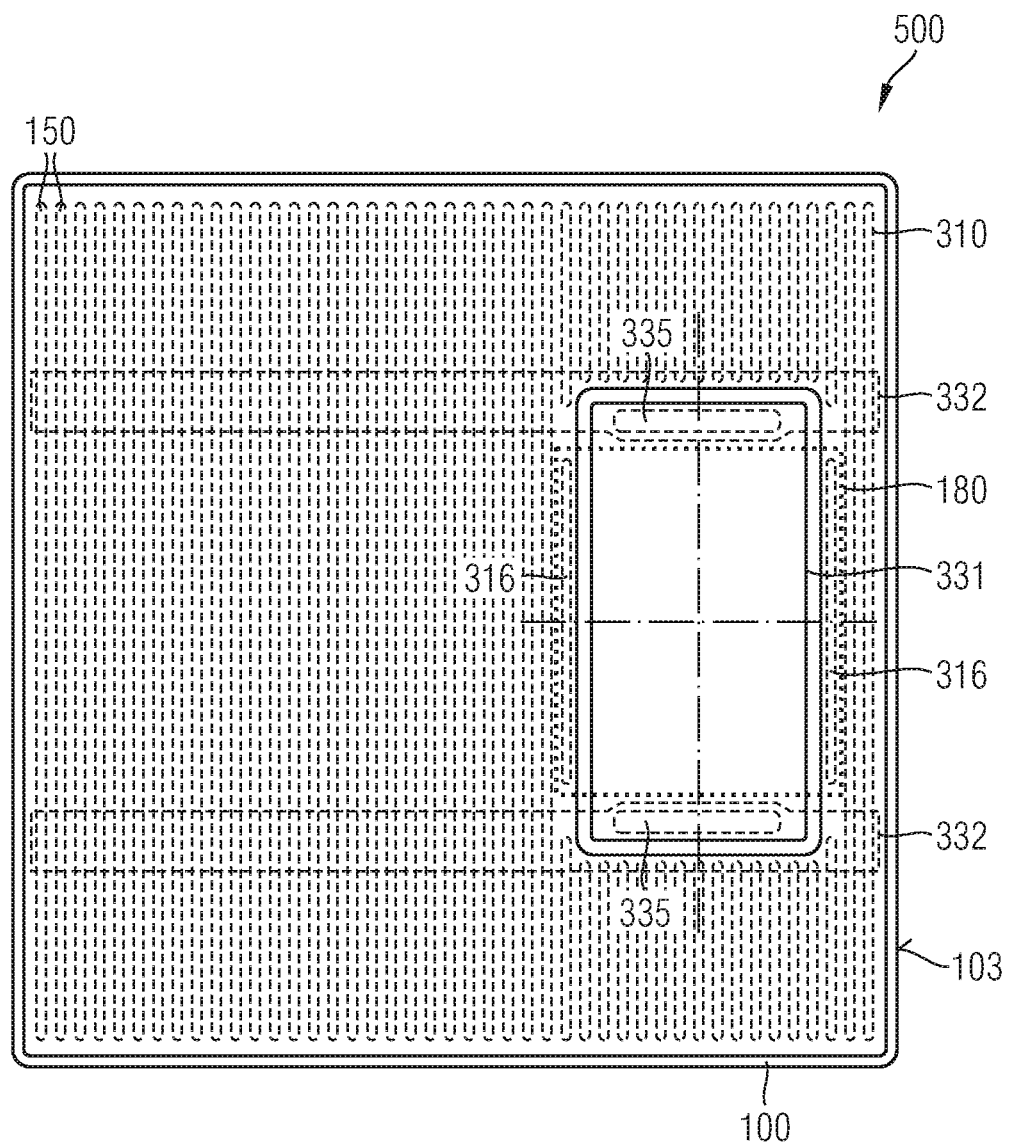
FIG. 7 is a schematic plan view of a semiconductor device in accordance with an embodiment related to a compensation structure formed around a gate pad.

The semiconductor device 500 of FIG. 7 includes a semiconductor portion 100 with an outer lateral surface 103 and with a plurality of stripe shaped trench gate structures 150. Two stripe shaped gate runners 332 run orthogonal to the gate trench structures 150. A rectangular gate pad 331 is formed in a rectangular opening of the source electrode 310. The gate pad 331 overlaps with both gate runners 332 and gate contacts 335 that electrically connect the gate runners 332 with the gate pad 331.

A doped region 180 containing aluminum atoms is formed in vertical projection of the gate pad 331 and may overlap on two opposite sides of the gate pad 331 with the source electrode 310. Second contact structures 316 extend from the source electrode 310 into the doped region 180 and electrically connect the doped region 180 with the source electrode 331.

The second contact structures 316 may be stripe shaped or may be dots, may be formed on both sides of the gate pad 331 or at one single side. A lateral extension between a center axis of the gate pad 331 and the second contact structures 316 and giving a minimum active horizontal extension of the doped region 180 is significantly greater than a pitch of the gate trench structures 150, for example, in a range from about 100 μm to about 500 μm. The active horizontal extension is that extension along which the compensation voltage drops.

Size and position of the second contact structures 316 relative to the doped region 180 relate to the resistance value of the doped region 180 such that the resistance value of the doped region 180 can be finely adjusted.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   transistor cells formed in a semiconductor portion from a wide-bandgap material, the transistor cells electrically connected to a gate terminal, a source electrode and a drain electrode;
   a compensation structure electrically connected to the gate terminal, the source electrode and the drain electrode, the compensation structure including
   a doped region within the semiconductor portion having a resistivity with a negative temperature coefficient,
   a gate metallization electrically connected to the gate terminal,
   an interlayer dielectric layer over a first surface of the semiconductor portion between the gate metallization and the doped region and forming a first capacitance structure between the gate metallization and the doped region, a second capacitance structure formed by a pn junction between the doped region and the semiconductor portion, wherein the semiconductor portion is electrically connected to the drain electrode on a second surface of the semiconductor portion opposite to the first surface, and
   wherein the doped region is electrically connected at the first surface to the source electrode on at least one side of the gate metallization and forms a lateral thermistor between the doped region and the source electrode in a direction of a center axis of the gate metallization.

2. The semiconductor device of claim 1, wherein the doped region is spaced apart from the first surface.

3. The semiconductor device of claim 1, wherein the doped region is doped with a p-type dopant that is not fully ionized at −40° C.

4. The semiconductor device of claim 3, wherein the p-type dopant is aluminum, and wherein the doped region contains aluminum at a concentration of at least 5E17 cm$^{-3}$.

5. The semiconductor device of claim 1, further comprising a contact structure extending through the interlayer dielectric to electrically connect the source electrode with the doped region.

6. The semiconductor device of claim 5, further comprising the contact structure extending through the interlayer dielectric to the first surface of the semiconductor portion to electrically connect the source electrode with the transistor cells, wherein the gate metallization is formed adjacent to and within an opening of the source electrode.

7. The semiconductor device of claim 1, wherein the doped region is electrically connected at the first surface to the source electrode on two sides of the gate metallization and forms the lateral thermistor between the doped region and the source electrode on the two sides of the gate metallization.

8. The semiconductor device of claim 7, wherein the gate metallization comprises a gate pad.

9. The semiconductor device of claim 1, wherein the wide-bandgap material comprises Silicon carbide (SiC).

10. The semiconductor device of claim 9, wherein the transistor cells comprise SiC MOSFETs.

11. A compensation structure for trench gate transistor cells formed from a wide-bandgap material within a semiconductor substrate and electrically connected to a gate terminal, a source electrode and a drain electrode, comprising:
   a first capacitance structure formed by an interlayer dielectric layer over a first surface of the semiconductor substrate between a gate metallization connected to the gate terminal and a doped region formed within the semiconductor substrate having a resistivity with a negative temperature coefficient, wherein the gate metallization, in a vertical projection, is over at least a portion of the doped region;
   a second capacitance structure formed by a pn junction between the doped region and the semiconductor substrate, wherein the semiconductor substrate is connected at a second surface to the drain electrode; and
   a thermistor formed by the doped region between an electrical connection on at least one side of the gate metallization to the source electrode and the first capacitance structure under the gate metallization and the second capacitance structure.

12. The semiconductor device of claim 11, wherein the doped region is spaced apart from the first surface.

13. The semiconductor device of claim 11, wherein the doped region is doped with a p-type dopant that is not fully ionized at −40° C.

14. The semiconductor device of claim 13, wherein the p-type dopant is aluminum, and wherein the doped region contains aluminum at a concentration of at least 5E17 cm$^{-3}$.

15. The semiconductor device of claim 11, further comprising a contact structure extending through the interlayer dielectric to electrically connect the source electrode with the doped region, the contact structure extending through the interlayer dielectric to the first surface of the semiconductor substrate to electrically connect the source electrode with the transistor cells, wherein the gate metallization is formed adjacent to and within an opening of the source electrode.

16. The semiconductor device of claim 11, wherein the doped region is electrically connected at the first surface to the source electrode on two sides of the gate metallization and forms the lateral thermistor between the doped region and the source electrode on the two sides of the gate metallization.

17. The semiconductor device of claim 11, wherein the wide-bandgap material comprises Silicon carbide (SiC).

18. The semiconductor device of claim 17, wherein the transistor cells comprise SiC MOSFETs.

19. A semiconductor device comprising:
   transistor cells formed in a semiconductor portion from a wide-bandgap material, the transistor cells electrically connected to a gate pad, a source electrode and a drain electrode, a contact structure extending through an interlayer dielectric over a first surface of the semiconductor portion to electrically connect the source electrode with the transistor cells, wherein the gate pad is formed over the interlayer dielectric over the first surface of the semiconductor portion within an opening of the source electrode;
   a compensation structure including a doped region within the semiconductor portion having a resistivity with a negative temperature coefficient, wherein the interlayer dielectric layer is between the gate pad and the doped region and forms a first capacitance structure between the gate pad and the doped region, a second capacitance structure formed by a pn junction between the doped region and the semiconductor substrate, wherein the semiconductor substrate is electrically connected to the drain electrode on a second surface of the semiconductor substrate opposite to the first surface.

20. The semiconductor device of claim 19, wherein the doped region is doped with a p-type dopant that is not fully ionized at −40° C.

21. The semiconductor device of claim 20, wherein the p-type dopant is aluminum, and wherein the doped region contains aluminum at a concentration of at least 5E17 cm$^{-3}$.

22. The semiconductor device of claim 19, wherein the gate pad is formed within a rectangular opening of the source electrode, and wherein the doped region is electrically connected at the first surface to the source electrode on two opposing sides of the gate pad to form the lateral thermistor between the doped region and the source electrode on the two opposing sides of the gate pad.

* * * * *